United States Patent
Griswold et al.

(10) Patent No.: US 9,625,540 B2
(45) Date of Patent: Apr. 18, 2017

(54) MAGNETIC RESONANCE FINGERPRINTING EXAMS WITH OPTIMIZED SOUND

(71) Applicant: Case Western Reserve University, Cleveland, OH (US)

(72) Inventors: Mark Griswold, Shaker Heights, OH (US); Yun Jiang, Cleveland Heights, OH (US); Dan Ma, Cleveland Heights, OH (US)

(73) Assignee: CASE WESTERN RESERVE UNIVERSITY, Cleveland, OH (US)

(*) Notice: Subject to any disclaimer, the term of this patent is extended or adjusted under 35 U.S.C. 154(b) by 849 days.

(21) Appl. No.: 14/024,915

(22) Filed: Sep. 12, 2013

(65) Prior Publication Data
US 2015/0070012 A1    Mar. 12, 2015

(51) Int. Cl.
*G01R 33/28* (2006.01)
*G01R 33/48* (2006.01)
*G01R 33/56* (2006.01)

(52) U.S. Cl.
CPC ....... *G01R 33/283* (2013.01); *G01R 33/4828* (2013.01); *G01R 33/56* (2013.01)

(58) Field of Classification Search
CPC ... G01R 33/283; G01R 33/4828; G01R 33/56
See application file for complete search history.

(56) References Cited

U.S. PATENT DOCUMENTS

| | | | | |
|---|---|---|---|---|
| 5,627,902 A * | 5/1997 | Ziarati | ............... | G01R 33/283 181/129 |
| 6,577,128 B1 * | 6/2003 | Smith | ............... | G01R 33/441 324/309 |
| 2005/0242810 A1 * | 11/2005 | Scheffler | ............ | G01R 33/5615 324/309 |
| 2008/0309343 A1 * | 12/2008 | Yamamizu | ............ | A61B 5/055 324/320 |
| 2012/0235678 A1 * | 9/2012 | Seiberlich | ............ | G01R 33/543 324/307 |
| 2013/0265047 A1 * | 10/2013 | Griswold | ............... | G01R 33/56 324/309 |

(Continued)

OTHER PUBLICATIONS

YouTube document having ULR address: https://www.youtube.com/watch?v=7MRm5mD2YxQ.*

*Primary Examiner* — G. M. Hyder
(74) *Attorney, Agent, or Firm* — Quarles & Brady LLP; Jack M. Cook

(57) ABSTRACT

Apparatus, methods, and other embodiments associated with optimizing sounds produced during nuclear magnetic resonance (NMR) fingerprinting are described. One example NMR apparatus includes an NMR logic to repetitively and variably sample a (k, t, E) space associated with a patient to acquire a set of NMR signals. Members of the set of NMR signals are associated with different points in the (k, t, E) space. Sampling is performed with t and/or E varying in a non-constant way. The varying parameters may include flip angle, echo time, RF amplitude, and other parameters. The parameters are varied in different acquisition blocks to facilitate matching sounds produced in response to the acquisition blocks to a desired set of sounds. The desired set of sounds may be a musical piece.

30 Claims, 10 Drawing Sheets

(56) References Cited

U.S. PATENT DOCUMENTS

| | | | | |
|---|---|---|---|---|
| 2014/0103924 A1* | 4/2014 | Griswold | ............. | G01R 33/561 324/309 |
| 2014/0167754 A1* | 6/2014 | Jerecic | ................... | G01R 33/56 324/309 |
| 2015/0301142 A1* | 10/2015 | Griswold | ........... | G01R 33/5608 324/309 |
| 2015/0302579 A1* | 10/2015 | Griswold | ........... | G01R 33/5608 382/128 |
| 2016/0025835 A1* | 1/2016 | Gulani | ............... | G01R 33/5635 600/420 |
| 2016/0124061 A1* | 5/2016 | Grodzki | ............. | G01R 33/3854 324/309 |

* cited by examiner

MAGNETIC RESONANCE FINGERPRINTING EXAMS WITH OPTIMIZED SOUND

BACKGROUND

Conventional magnetic resonance imaging (MRI) involves using similar to identical acquisition blocks over and over. For example, in repetitive acquisition blocks, repetition time (TR) may be the same, gradients other than the phase encoding gradient may be held constant, and other parameters may be identical. The repetitive identical or similar acquisition blocks may induce significant vibrations in the MRI scanner hardware. These vibrations may cause significant, undesirable sounds that may manifest themselves as clicks or even what patients describe as "banging". Loud, repetitive banging is a significant patient complaint about MRI.

Conventional magnetic resonance (MR) pulse sequences include a preparation phase, a waiting phase, and an acquisition phase that are configured to produce signals from which images can be made. The preparation phase determines when a signal can be acquired and determines the properties of the acquired signal. For example, a first pulse sequence may be designed to produce a T1-weighted signal at a first echo time (TE) while a second pulse sequence may be designed to produce a T2-weighted signal at a second TE. T1 is spin-lattice relaxation and T2 is spin-spin relaxation. A conventional MR acquisition involves numerous repetitions of prepare/wait/acquire pulse sequences. For example, the first pulse sequence may be applied a large number of times to acquire T1 weighted signals for all voxels in a volume of interest (RoI) and then the second pulse sequence may be applied a large number of times to acquire T2 weighted signals for all the voxels in the RoI. When these preparations and waits are repeated under similar to identical conditions over and over, the repetitive actions may lead to undesirable sound effects for the patient in the MRI apparatus.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Example apparatus and methods employ a series of varied magnetic resonance fingerprinting (MRF) acquisition blocks to improve the patient experience with respect to sounds encountered during interaction with an MR apparatus. In one embodiment, music is played for a patient in the bore through headphones or other speakers and the MRF acquisition blocks are configured to control the gradient sounds to present as background sounds for the music. MRF is described in Magnetic Resonance Fingerprinting, Griswold et al., Nature 495, 187-192 (14 Mar. 2013) and in U.S. patent application Ser. No. 13/051,044, the contents of both of which are incorporated herein by reference. In MRF, an acquisition block may have a variable number of radio frequency (RF) energy pulses and gradient switches and a series of MRF acquisition blocks may vary.

Larger objects like human bodies are made up of smaller objects like arms and legs and hips. The smaller objects are in turn made up of smaller parts like skin, muscle, fat, bone, tendon, and prosthetics. These smaller parts are in turn made up of even smaller things like water and minerals. The water and minerals are themselves made up of even smaller things (e.g., hydrogen, oxygen) which in turn are made up of even smaller things (e.g., electrons orbiting a nucleus). The nucleus may include a proton that exhibits "spin". A human body has a large number of protons and thus a large number of spins.

Figure 5:
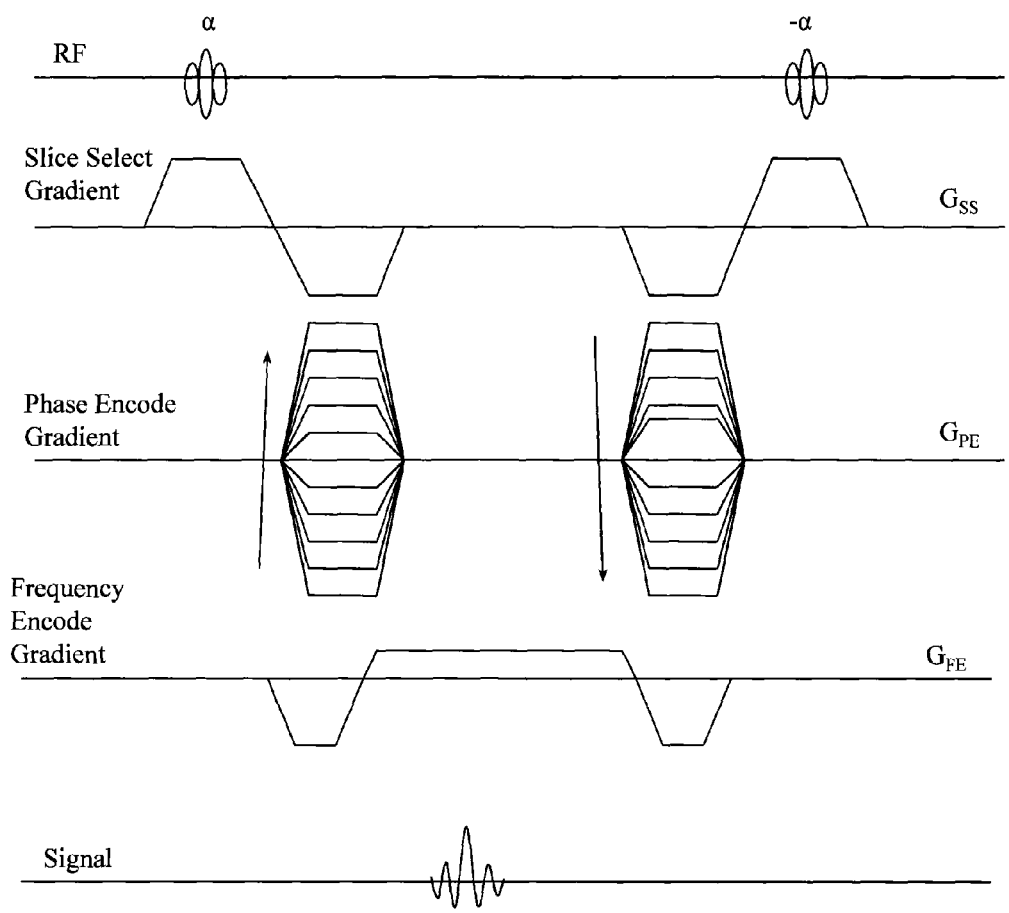
FIG. 5 illustrates a conventional repetitive sequence.

In the presence of a magnetic field, some of the spins will align in one direction (e.g., N/S) with respect to that magnetic field while other spins will align in an opposite direction (e.g., S/N) with respect to that magnetic field. Conventional MRI manipulates the magnetic field so that a net alignment in one direction is achieved. Conventional MRI further manipulates the magnetic field so that local differences in the field are achieved to allow spatial encoding. For example, x, y, and z gradients may be applied to create local variations in the larger magnetic field. FIG. 5 is a pulse sequence diagram of a conventional MRI acquisition where different gradients are used for slice selection, phase encoding, and frequency encoding. The gradients produce local variations that allow the excitation of some spins without the excitation of other spins. Selective excitation is possible because of the Larmor relationship between magnetic fields and spins. The Larmor relationship describes how the frequency at which spins accept RF energy is related to the magnetic field in which the spins are located. In FIG. 5, gradients other than the phase encoding (PE) gradient are held constant while the PE gradient varies slightly during repetitive instances of the pulse sequence.

With the local variations created, RF energy may be applied that causes a selected sets of spins associated with a local variation to behave in a certain way. For example, spins may be forced into a high energy state and forced away from their default alignment. When the RF energy is removed, the spins may return or may be forced to return to their default alignment. Different spins may return to their default alignment at different rates. Similarly, spins may return to their default alignment for different reasons. As the spins return from the forced alignment to the natural alignment, the spins produce a signal that can be detected for a short period of time. Conventional systems are limited by this short period of time and must, therefore, constantly repeat the process that tips the spins out of one alignment and into another alignment from which they can return and produce signal. The constant repetition may produce vibrations that lead to unpleasant sounds.

Like conventional MR, MRF manipulates the magnetic field and manipulates the application of RF energy at different frequencies. However, example apparatus and methods employ carefully crafted pseudo-random routines that allow a volume to produce the signal(s) the volume is going to produce in response to a variety of changing conditions created by a variety of changing applications of RF energy. Varying the conditions facilitates removing the stimulus that creates the vibrations that lead to the typical banging noises. Varying the conditions also facilitates producing pleasing sounds like notes, tones, or music while still simultaneously acquiring the data required to form a diagnostic exam.

The frequency at which water in a volume will accept RF energy is determined by the magnetic field in which the water is located. The frequency can be computed when the magnetic field is known. The frequency at which fat in the same volume will accept RF energy is also determined by the magnetic field in which the fat is located. This frequency can also be computed when the magnetic field is known. Thus, applying multiple frequencies can induce multiple resonant species to resonate. Applying the multiple frequencies under a series of different conditions at different times can cause the resonant species to resonate in different ways. Additionally, applying the multiple frequencies under different conditions at different times can cause the resonant species to resonate and relax in different ways. The different resonations and different relaxations may yield a unique signal evolution for a combination of resonant species. Applying the multiple frequencies under different conditions facilitates mitigating the unpleasant sound effects associated with applying the same frequencies at the same conditions over and over.

Example apparatus and methods employ various sequence optimizations that take advantage of the multiple degrees of freedom in MRF to reduce the conditions that produce unpleasant sounds in conventional MRI. Example apparatus and methods may also employ various sequence optimizations to not just reduce the conditions that produce unpleasant sounds, but to actually produce pleasant sounds (e.g., music, rhythms). In one example, acquisition blocks may be configured or chosen so that gradient waveforms associated with the acquisition blocks match previously recorded music. In one embodiment, MRF optimizations are used to generate music based on a user chosen MP3 file.

Depending on the form of the MRF acquisition, different gradient moments may need to be taken into account. Thus, in one embodiment, acquisition blocks may be configured or selected as a function of multi-parametric optimization. An optimization for a gradient waveform for a given acquisition block may be, for example:

$$G_{opt} = \min_G \|G-M\| + \alpha \Sigma G + \beta \Sigma Gt \quad \text{Equation 1}$$

where the first term operates to make the gradient waveform G resemble the desired musical waveform M, where the second term is a weighted contribution for the zero-moment of the gradient waveform G, and where the third term controls for the first-moment of the gradient waveform.

In one embodiment, selecting or configuring acquisition blocks based on a set of multi-parametric optimizations may cause the MR apparatus to produce a musical sound instead of the traditional unpleasant banging. In one embodiment, a patient may be given an opportunity to choose a musical sequence to be performed during their MR procedure.

A gradient system in an NMR apparatus may not be able to reproduce the full range of sounds for a given musical piece. For example, it may be difficult, if even possible at all, for a gradient system to produce certain high frequency sounds. In one embodiment, to account for the mismatch between sounds that can be produced and sounds that are desired to match the musical piece, a speaker, transducer, or other apparatus may be added to the MR apparatus. For example, the speaker or transducer may be placed in or on the magnetic bore and configured to contribute to the overall sound produced. Contributing to the overall sound may include, for example, generating a missing sound, reducing an error induced sound, harmonizing to an existing sound, cancelling a sound, copying the desired sound, or other action.

In one embodiment, the speaker may use the main magnetic field produced by the MR apparatus to perform sound transduction onto a membrane. In another embodiment, a transducer may be installed in the MR apparatus (e.g., into scanner hardware) so that the additional vibrations produced by the MRF approach are induced into the scanner hardware. For example, the additional vibrations may be induced into an RF coil, into the bore, or into other pieces of the MR apparatus.

Selecting appropriate MRF acquisition blocks to produce gradient waveforms that facilitate mimicking or reproducing music may involve combining a search process with RF pulse design. One example search process may identify zero crossings of a target musical waveform. For example, a set of crossings may be identified for the target musical waveform. The set of zero crossings may become anchor points in the design of an RF pulse for an MRF acquisition block. In one embodiment, the gradient waveform between crossing points may be optimized to be as close to the musical waveform as possible. In another embodiment, the gradient waveform between crossing points may be optimized to be as easily correctable with respect to the musical waveform as possible. In yet another embodiment, the gradient waveform between crossing points may be optimized to cancel the musical waveform as much as possible so that a pure replacement sound can be introduced using, for example, a speaker or transducer available in the MR apparatus. The gradient strength and shape between subsequent points may then be optimized to meet other requirements. For example, the gradient strength and shape between the next two points may be optimized to meet requirements associated with both the RF pulse and the musical waveform. The RF pulse may then be generated using, for example, a variable rate selective excitation (VERSE) method for the target slice profile and gradient waveform.

The following includes definitions of selected terms employed herein. The definitions include various examples and/or forms of components that fall within the scope of a term and that may be used for implementation. The examples are not intended to be limiting. Both singular and plural forms of terms may be within the definitions.

MP3 refers to an MPEG-1 Audio Layer III file or an MPEG-2 Audio Layer III file, where MPEG refers to Movie Pictures Experts Group.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a non-transitory medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Data store", as used herein, refers to a physical and/or logical entity that can store data. A data store may be, for example, a database, a table, a file, a data structure (e.g. a list, a queue, a heap, a tree) a memory, a register, and other stores. In different examples, a data store may reside in one logical and/or physical entity and/or may be distributed between two or more logical and/or physical entities.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"Signal", as used herein, includes but is not limited to, electrical signals, optical signals, analog signals, digital signals, data, computer instructions, processor instructions, messages, a bit, a bit stream, or other means that can be received, transmitted and/or detected.

"User", as used herein, includes but is not limited to one or more persons, software, computers or other devices, or combinations of these.

Figure 1:
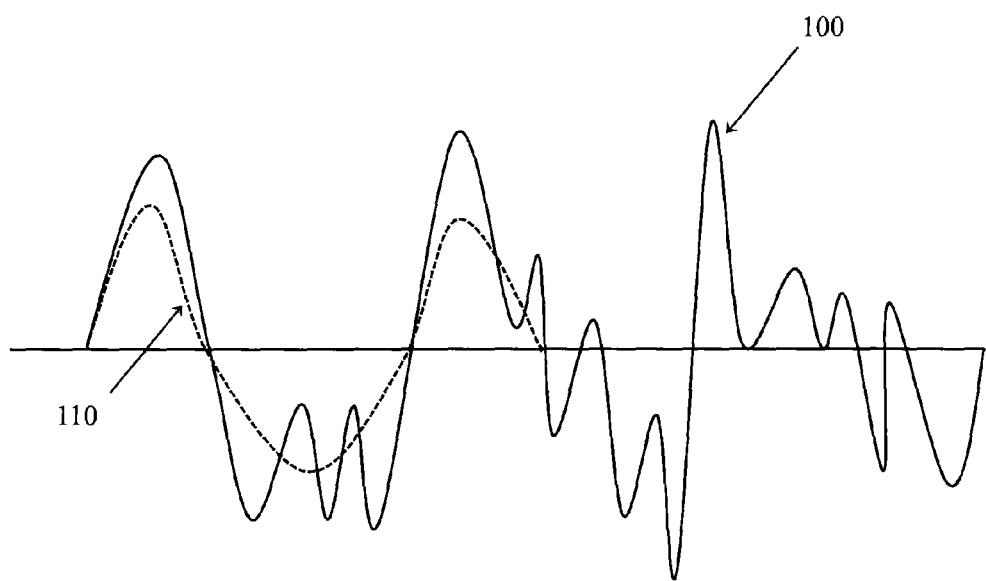
FIG. 1 illustrates a gradient waveform associated with a magnetic resonance fingerprinting (MRF) acquisition and a music waveform.

FIG. 1 illustrates an acoustic waveform 100 and a gradient waveform 110. The acoustic waveform 100 may be associated with, for example, a song or musical piece. The gradient waveform 110 is associated with a series of MRF acquisition blocks. MRF acquisition blocks control local conditions using gradients. The gradients may change from acquisition block to acquisition block, which facilitates producing a gradient waveform. Example apparatus and methods configure the MRF acquisition blocks to facilitate establishing a relationship between gradient waveform 110 and acoustic waveform 100. For example, MRF acquisition blocks may be designed, configured, or selected so that gradient waveform 110 will resemble or match acoustic waveform 100.

Figure 2:
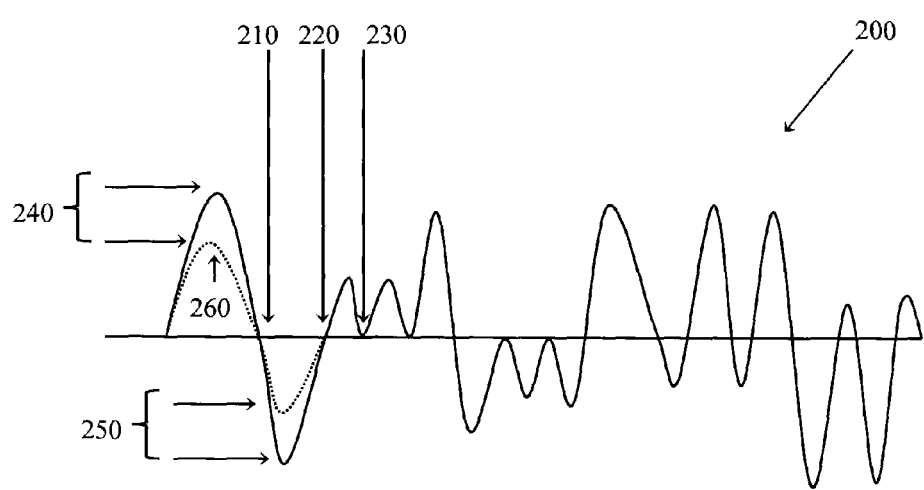
FIG. 2 illustrates a gradient waveform associated with an MRF acquisition and a music waveform.

FIG. 2 illustrates an acoustic waveform 200 and a gradient waveform 260. FIG. 2 shows several zero crossings for waveform 200. For example, zero crossings are illustrated at 210, 220, and 230. Example apparatus and methods may select, configure, or apply MRF acquisition blocks based, at least in part, on the locations of these zero crossings. For example, in an attempt to match gradient waveform 260 to acoustic waveform 200, the zero crossings may be identified and used to control the duration or other parameters of an MRF acquisition block or series of MRF acquisition blocks. Even with variable MRF acquisition blocks available and with the zero crossings identified, it may be difficult to perfectly match gradient waveform 260 to acoustic waveform 200. The difficulty may arise, in part, because gradients cannot simply be switched instantaneously from any arbitrary configuration to any other arbitrary configuration. Thus, differences 240 and 250 may be present. Example apparatus and methods may attempt to minimize the impact of differences 240 and 250 by configuring, selecting, or employing specific MRF acquisition blocks.

Figure 3:
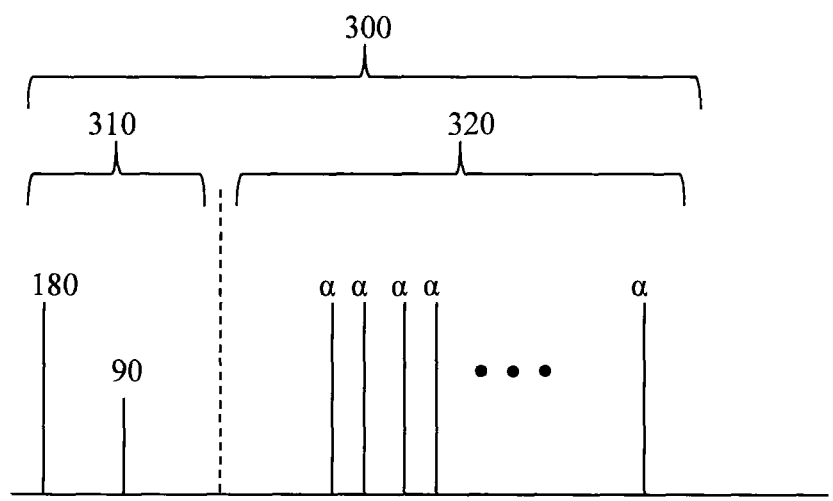
FIG. 3 compares and contrasts conventional sequence blocks to example MRF sequence blocks.
Figure 3:
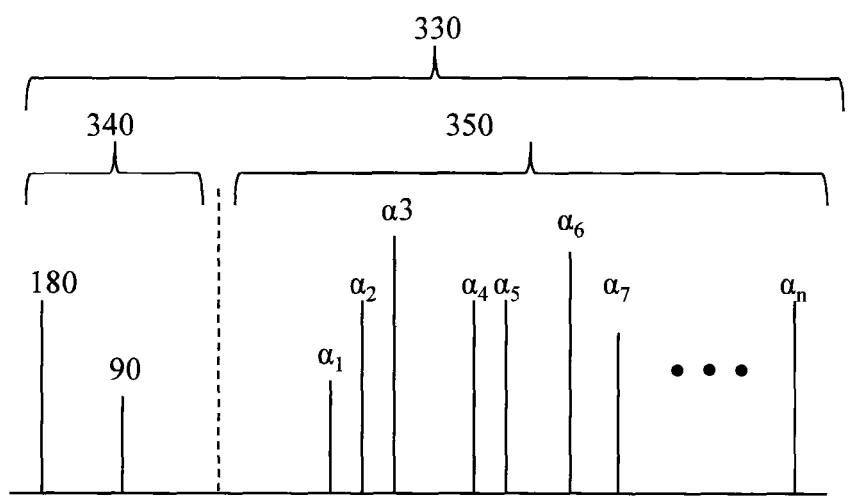

FIG. 3 compares and contrasts conventional sequence blocks to example MRF sequence blocks. Sequence block 300 includes a preparation phase 310 and an acquisition phase 320. During acquisition phase 320, multiple acquisitions using the same flip angle and the same interval between acquisitions may be performed. Acquisition phase 320 facilitates acquiring data from a (k, t) space, where t varies either constantly or linearly and where k refers to k-space. The constant variation facilitates acquiring signal with constant amplitude and phase as required for conventional image reconstruction. However, the repetition in acquisition phase 320 may lead to the unpleasant sound effects.

MRF sequence block 330 also includes a phase 340 and an acquisition phase 350. Notice that acquisition phase 350 is much longer than acquisition phase 320. Unlike acquisition phase 320 where parameters are either fixed or vary linearly, in acquisition phase 350 the parameters may vary widely, either non-linearly, randomly, or pseudo-randomly. Parameters that may vary include, but are not limited to, echo time, flip angle, phase encoding, gradients applied, and others. Note also that while phase 340 may, in some examples, be a preparation phase or preparation-like phase, phase 340 does not necessarily perform a conventional preparation. The wide variations that are possible and selectable in acquisition phase 350 reduce the conditions under which the unpleasant sounds associated with repetitive substantially similar or identical acquisitions produce and facilitate producing desired sounds.

Figure 4:
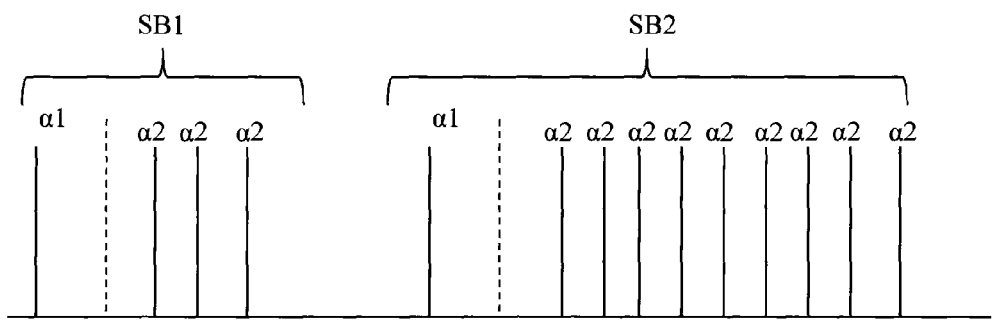
FIG. 4 illustrates an example set of sequence blocks.

FIG. 4 illustrates another example set of sequence blocks. In FIG. 4, a first sequence block SB1 has a first alpha pulse $\alpha 1$ and a series of identical $\alpha 2$ pulses. In FIG. 4, a second sequence block SB2 has the same first alpha pulse α1 and a different series of identical α2 pulses. The phase may be the same for the α2 pulses. Thus, in this example, the only difference between members of the set of sequence blocks is the number of α2 pulses. However, changing the number of α2 pulses between sequence blocks facilitates disrupting the repetitive rhythm that may set up vibrations associated with unpleasant sounds. One skilled in the art will appreciate that other sets of sequence blocks may be employed.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 6:
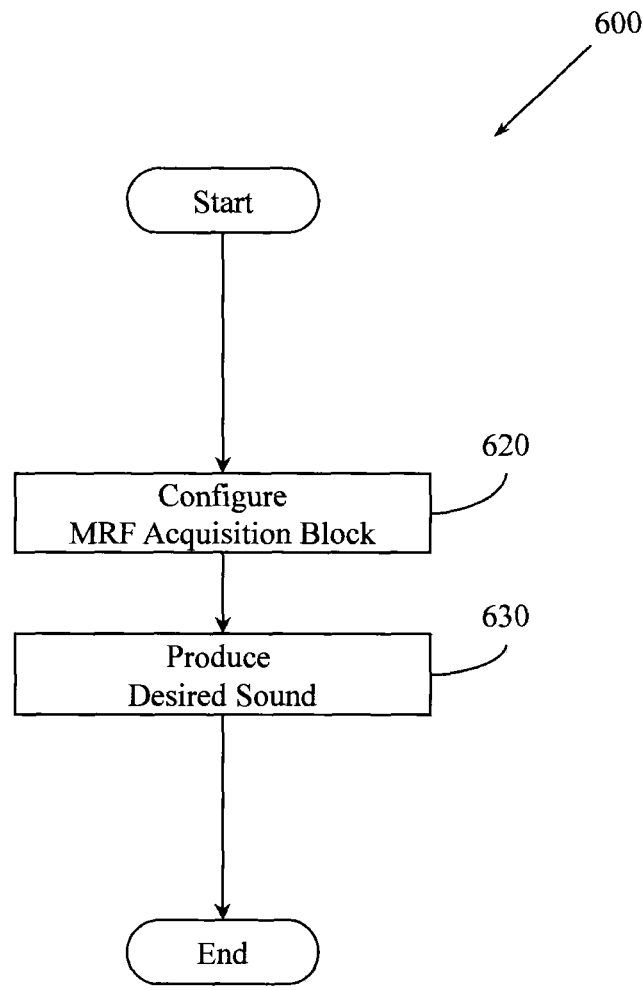
FIG. 6 illustrates an example method associated with magnetic resonance fingerprinting exams having optimized sound.

FIG. 6 illustrates a method 600 for controlling an MR apparatus performing an MRF procedure on a patient. Method 600 includes, at 620, configuring an MRF acquisition block as a function of the desired acoustic waveform. The desired acoustic waveform may be associated with, for example, a portion of a piece of music. The music may be stored, for example, in an MP3 file. In one embodiment, to increase patient comfort, accessing the desired acoustic waveform includes selecting the desired acoustic waveform as a function of a user choice. For example, a user may choose between classical music, whale sounds music, or music from other genres. Accessing the desired acoustic waveform may include, for example, opening a file, receiving data, accessing a table in a database, establishing a communication link to a music server, receiving an electronic signal, or other action.

Recall that an MRF acquisition block includes one or more excitation phases, one or more readout phases, and one or more waiting phases. An MRF procedure will include a series of variable MRF acquisition blocks that will differ in one or more block parameters. The block parameters may include, for example, echo time, flip angle, phase encoding, diffusion encoding, flow encoding, RF pulse amplitude, RF pulse phase, number of RF pulses, type of gradient applied between an excitation portion of an acquisition block and a readout portion of an acquisition block, number of gradients applied between an excitation portion of an acquisition block and a readout portion of an acquisition block, type of gradient applied between a readout portion of an acquisition block and an excitation portion of an acquisition block, number of gradients applied between a readout portion of an acquisition block and an excitation portion of an acquisition block, type of gradient applied during a readout portion of an acquisition block, number of gradients applied during a readout portion of an acquisition block, amount of RF spoiling, and amount of gradient spoiling.

In one embodiment, configuring the MRF acquisition block at 620 includes varying the amount of time between acquisition blocks in the series of variable MRF acquisition blocks, varying the number of α2 pulses in an acquisition block, varying the relative amplitude of RF pulses in acquisition blocks in the series of variable MRF acquisition blocks, varying the relative phase of RF pulses in acquisition blocks in the series of variable MRF acquisition blocks, or varying other parameters. The varying may be controlled to produce output waveforms that are useful in producing pleasing sounds instead of the typical repetitive banging noises associated with conventional MRI.

Method 600 also includes, at 630, producing a desired sound in the MR apparatus. Producing the desired sound may include causing the MR apparatus to apply one or more gradients and one or more RF pulses according to the MRF acquisition block as part of the MRF procedure. Applying the gradients or RF pulses may produce vibrations that in turn produce sounds that are audible to the patient. The sounds may be produced by different devices.

In one example, producing the desired sound in the MR apparatus includes providing a signal to a speaker located in the main magnetic field of the MR apparatus. Since the speaker is located in the main magnetic field, since speakers typically have their own ferromagnetic magnet, and since the main magnetic field may be, for example, 1.5 T, 3 T, 7 T or other strong fields where outside ferromagnetic materials should not be positioned, the speaker does not include a magnet. Therefore, producing the desired sound may include providing a signal to a speaker that does not include its own magnet but that produces sound using the main magnetic field of the MR apparatus.

In one example, producing the desired sound in the MR apparatus includes providing a signal to a transducer. The transducer may be configured to produce a vibration in a portion of the MR apparatus. For example, a gradient coil or RF coil may be made to vibrate in a certain way that facilitates producing a pleasing sound (e.g., music). Different portions of an MR apparatus may have different properties. For example, different gradient coils or other coils may have different sound output models. Therefore, when producing the desired sound includes sending a signal to a transducer or otherwise controlling a transducer, the MRF acquisition block may be configured, selected, or performed as a function of the desired acoustic waveform and a sound output model associated with a gradient coil in the MR apparatus.

Figure 7:
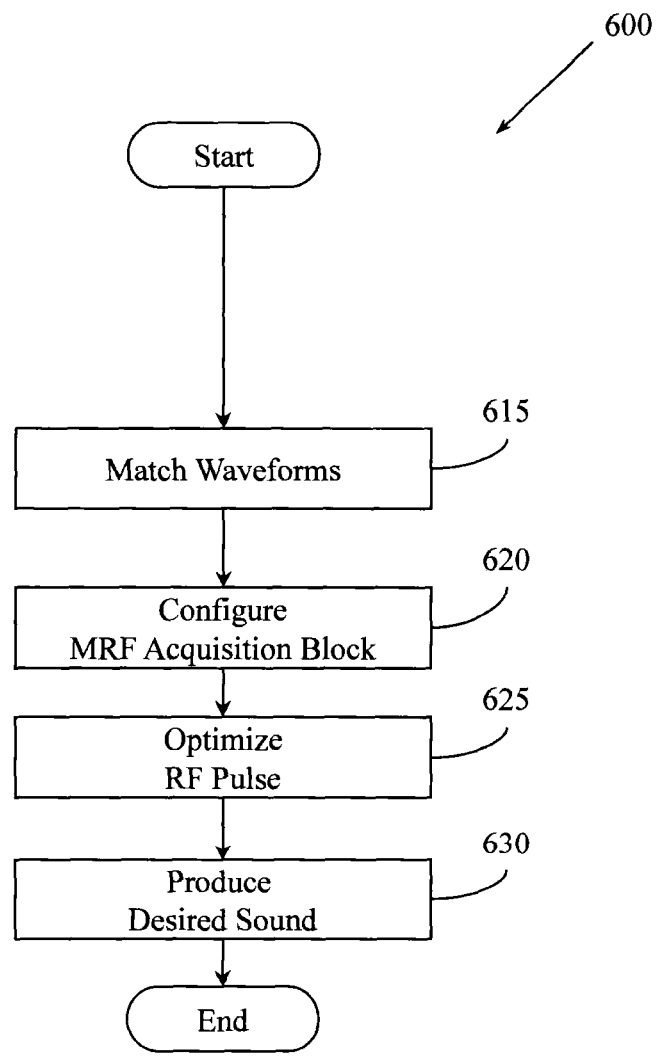
FIG. 7 illustrates an example method associated with magnetic resonance fingerprinting exams having optimized sound.

FIG. 7 illustrates another embodiment of method 600 (FIG. 6). This embodiment includes actions 620 and 630. However, this embodiment also includes additional actions. For example, this embodiment of method 600 also includes, at 615, matching a gradient waveform associated with the MRF acquisition block to the desired acoustic waveform. In one example, the matching may seek to minimize differences between the gradient waveform and the desired acoustic waveform. In another example, the matching may seek to produce a gradient waveform that harmonizes with the desired acoustic waveform or that is easily corrected in light of the desired acoustic waveform. Different types of matching may be performed. Harmonizing with the desired acoustic waveform means being part of a combination of sounds that are pleasing to the ear, or being part of a combination of sounds, pitches, tones, or notes that represent a chord (e.g., major triad, minor triad) or that satisfy the Pythagorean tuning law of whole number ratios or other useful, non-dissonant arrangements. In one example, harmonizing with the desired waveform may include producing a sound that in combination with the acoustic waveform produces a standard musical chord.

In one example, matching the gradient waveform to the desired acoustic waveform may be performed as a function of a multi-parametric optimization. In one embodiment, the multi-parametric optimization is:

$$G_{opt} = \min_G \|G - M\| + \alpha \sum G + \beta \sum Gt$$

where:

$G_{opt}$ is an optimized gradient waveform associated with the acquisition block, G is a candidate gradient waveform, t is time, Gt is G times t (the first moment of the gradient waveform), M is the desired acoustic waveform, α is a variable weight, and β is a variable weight.

Performing the matching at 615 may include configuring αΣG as a weighted contribution to $G_{opt}$ to account for gradient refocusing for a moment of G. For example, αΣG may be configured to account for gradient refocusing in balanced steady state free precession (bSSFP) MRF, in quick echo split technique (QUEST) MRF, or in fast imaging with steady-state precession (FISP) MRF. The moments of a waveform provide the basis for characterizing the waveform. A waveform refers to the shape and form of a wave, where a wave is a disturbance or oscillation that travels through space or matter accompanied by a transfer of energy.

Performing the matching at 615 may also include configuring βΣGt as a flow term to account for gradient refocusing for a different moment of G. In one embodiment, performing the matching may include configuring βΣGt to control for flow sensitivity in the MRF procedure or to control for diffusion sensitivity in the MRF procedure. Other higher-order moments can also be added to this optimization procedure.

This embodiment of method 600 also includes, at 625, optimizing an RF pulse associated with the MRF acquisition block. In one example, optimizing the RF pulse includes designing the RF pulse as a function of zero crossings of the desired acoustical waveform. The zero crossings may be identified and then an MRF acquisition block selected or configured to pattern match the desired acoustic waveform based on the zero crossings. The matching may seek to minimize differences between the gradient waveform and the desired acoustic waveform, to produce a gradient waveform that is easily correctable with respect to the desired acoustic waveform, to facilitate cancelling a sound, or other actions. In one example, the RF pulse may then be produced using a variable rate selective excitation (VERSE) approach.

While FIGS. 6 and 7 illustrate various actions occurring in serial, it is to be appreciated that various actions illustrated in FIGS. 6 and 7 could occur substantially in parallel. By way of illustration, a first process could access desired acoustic waveforms and analyze their properties (e.g., zero crossings), a second process could configure acquisition blocks based on pattern matching between the desired acoustic waveform and a gradient waveform associated with acquisition blocks, and a third process could control the production of sound based on the acquisition blocks. While three processes are described, it is to be appreciated that a greater and/or lesser number of processes could be employed.

Figure 8:
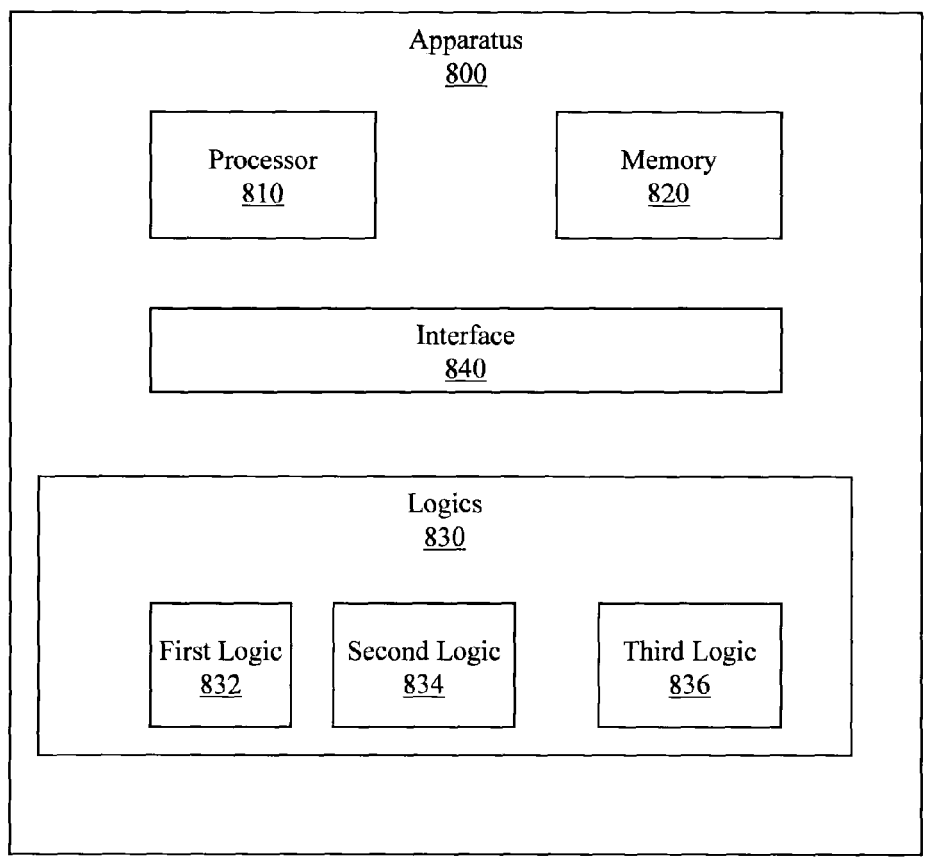
FIG. 8 illustrates an example apparatus associated with magnetic resonance fingerprinting exams having optimized sound.

FIG. 8 illustrates an apparatus 800. Apparatus 800 includes a processor 810, a memory 820, a set 830 of logics, and an interface 840 that connects the processor 810, the memory 820, and the set 830 of logics. The processor 810 may be, for example, a microprocessor in a computer, a specially designed circuit, a field-programmable gate array (FPGA), an application specific integrated circuit (ASIC), a processor in a mobile device, a system-on-a-chip, a dual or quad processor, or other computer hardware. The set 830 of logics may be configured to produce pleasing sounds (e.g., musical notes, songs, calming tones) for an MRF patient instead of the traditional clicks and bangs associated with conventional MRI. Apparatus 800 may be, for example, a computer, a laptop computer, a tablet computer, a personal electronic device, a smart phone, a system-on-a-chip (SoC), or other device that can access and process data for an NMR apparatus.

In one embodiment, the apparatus 800 may be a general purpose computer that has been transformed into a special purpose computer through the inclusion of the set 830 of logics. Apparatus 800 may interact with other apparatus, processes, and services through, for example, a computer network. In one embodiment, the apparatus 800 may be incorporated in an NMR apparatus.

Apparatus 800 includes a first logic 832 that is configured to provide electronic data concerning a first acoustic waveform. In one embodiment, the first acoustic waveform is associated with a piece of music stored in an MP3 file on a music storage device. The music storage device may be, for example, a personal music device, a disk drive, a solid state drive, or other data store. When the data store includes multiple pieces of music, the first logic 832 may provide a user with choices for music to be played. Providing the electronic data may include, for example, providing amplitude modulated signals, providing frequency modulated signals, providing frequency and duration information for a note, providing a mathematical description of a portion of a wave, provide a description of the moments, amplitude, frequency, or wavelength of a portion of the first acoustic waveform, providing musical notes or a score that describe the first acoustic waveform, providing computer data, or other actions.

Apparatus 800 also includes a second logic 834 that is configured to program a series of variable MRF sequence blocks as a function of the electronic data. A sequence block may have a number of acquisition blocks. Recall that an MRF sequence block includes one or more excitation phases, one or more readout phases, and one or more waiting phases. Recall additionally that in one example at least one member of the series of sequence blocks differs from at least one other member of the series of sequence blocks in at least one of, the number of α2 pulses in a sequence block, the spacing of α2 pulses in a sequence block, the phase of α2 pulses in a sequence block, the amplitude of α2 pulses in a sequence block, gradients applied during the sequence block, or other parameters. Being able to select how members of the series of sequence blocks will vary facilitates producing a gradient waveform that is related to the first acoustic waveform. For example, sequence blocks may be configured and arranged to facilitate reproducing the first acoustic waveform.

In one embodiment, the second logic 834 is configured to program the series of MRF sequence blocks based, at least in part, on matching a gradient waveform associated with the MRF sequence blocks to the first acoustic waveform. The gradient waveform may be produced as the MRF sequence blocks change from block to block. For example, a first sequence block may use a first set of gradients and a second sequence block may use a second, different set of gradients. As the gradient changes from sequence block to sequence block, the gradient waveform may be produced. The second logic 834 may match the waveforms in different ways. For example, the second logic 834 may seek to have the second acoustic waveform reproduce or harmonize with the first acoustic waveform. Since the second acoustic waveform is an acoustic waveform, it may be used to produce sounds that are audible to the patient during the MRF procedure. The matching may be based on a multi-parametric optimization like that described in association with method 600. Other optimizations and multi-parametric optimizations may be employed.

In one embodiment, the second logic 834 may be configured to optimize an RF pulse associated with a member of the series of MRF sequence blocks. The optimization may be based, at least in part, on zero crossings of the first acoustic waveform. Different optimizations may be undertaken in different embodiments. For example, second logic 834 may optimize the RF pulse so that a gradient waveform associated with the RF pulse and an MRF sequence block matches the first acoustic waveform as closely as possible. Second logic 834 may, alternatively or additionally, optimize the RF pulse so that a gradient waveform associated with the RF pulse and an MRF sequence block is correctable to the first acoustic waveform, or so that a gradient waveform associated with the RF pulse and an MRF sequence block harmonizes with the desired acoustic waveform. Other optimizations are possible.

Apparatus 800 also includes a third logic 836 that is configured to control an NMR apparatus to apply RF energy to a patient as part of an MRF procedure. The RF energy will be applied according to (e.g., as controlled by) the series of variable MRF sequence blocks. Applying the RF energy according to the series of variable MRF sequence blocks produces a second acoustic waveform that is related to the first acoustic waveform. Applying the RF energy may include generating an RF pulse, manipulating a gradient, or other action performed by the NMR apparatus. In one embodiment, the third logic 836 is configured to produce an RF pulse using a variable rate selective excitation (VERSE) approach.

Figure 9:
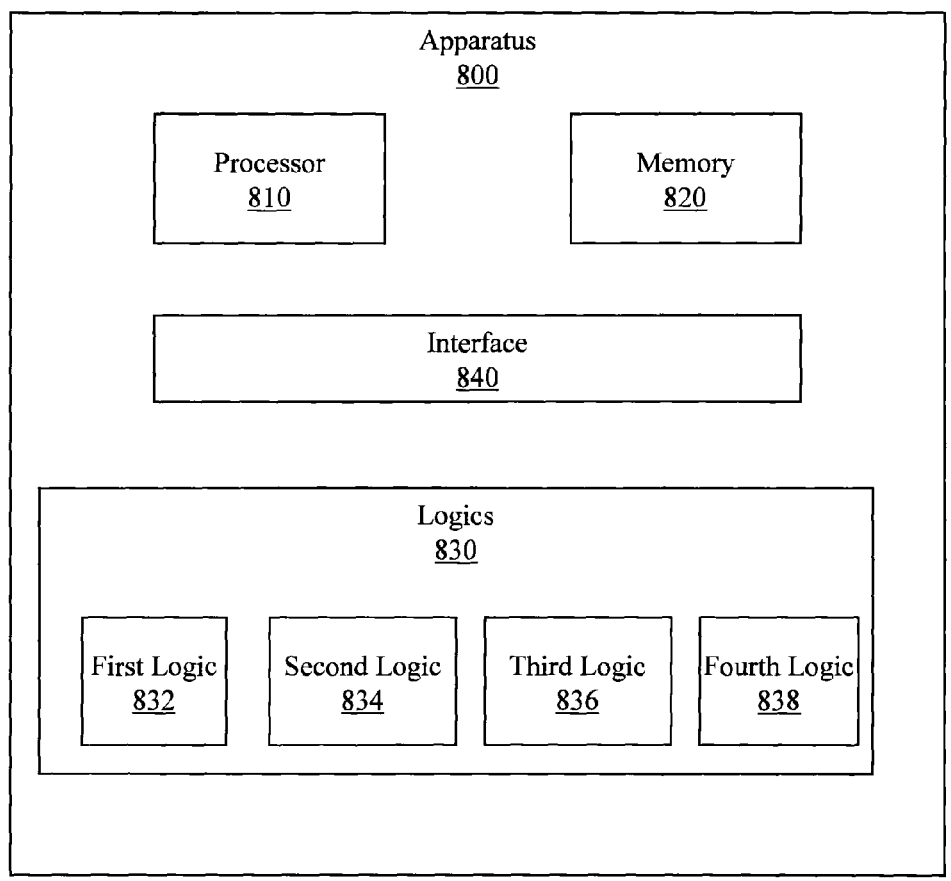
FIG. 9 illustrates an example apparatus associated with magnetic resonance fingerprinting exams having optimized sound.

In one embodiment, the NMR apparatus controlled by apparatus 800 includes a speaker or a transducer. In this embodiment, the third logic 836 may be configured to provide a control signal to the speaker or transducer. The control signal is configured to control the speaker or transducer to produce a sound that is a function of the gradient waveform FIG. 9 illustrates another embodiment of apparatus 800 (FIG. 8). This embodiment of apparatus 800 includes a fourth logic 838. Fourth logic 838 may be configured to receive a set of MRF data from the NMR apparatus. The set of MRF data concerns a (k, t, E) space associated with the patient, where t is time and E includes at least one of, T1, T2, and one other parameter. T1 is spin-lattice relaxation and T2 is spin-spin relaxation. In the set of MRF data, one or more of, t, and E, vary non-linearly. The data in the (k, t, E) space is produced as a function of applying the RF energy to the patient according to the series of variable MRF sequence blocks.

Figure 10:
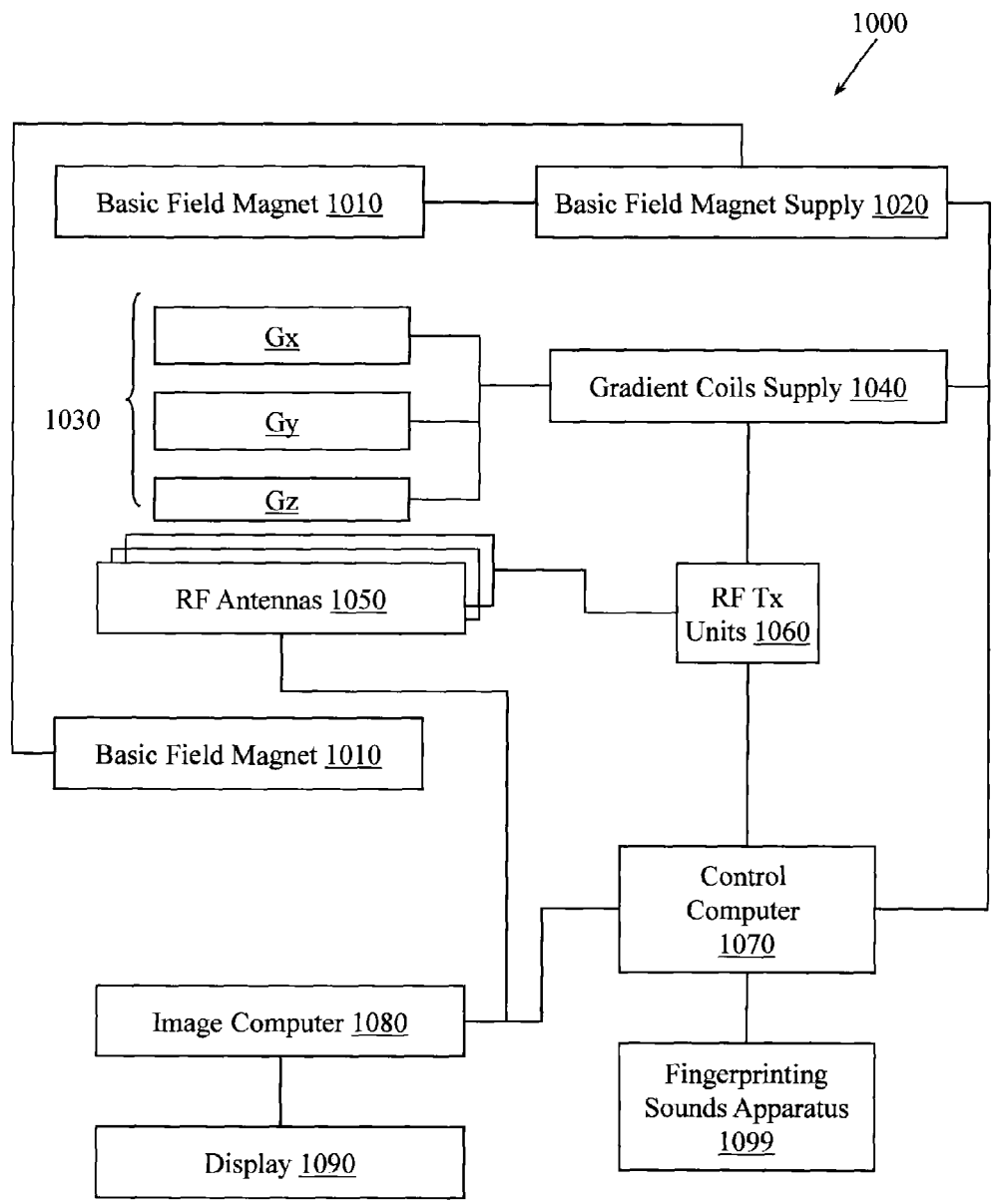
FIG. 10 illustrates an MR apparatus configured to perform magnetic resonance fingerprinting exams having optimized sound.

FIG. 10 illustrates an example MRF apparatus 1000 configured with a fingerprinting sounds apparatus 1099 to facilitate MRF with optimized sounds. The fingerprinting sounds apparatus 1099 may be configured with elements of example apparatus described herein or may perform example methods described herein. While fingerprinting sounds apparatus 1099 is illustrated as part of MR apparatus 1000, in one example, fingerprinting sounds apparatus 1099 may be a separate apparatus or apparatuses.

In one embodiment, fingerprinting sounds apparatus 1099 may provide means for generating music that is audible to a patient undergoing an MRF procedure in the MRF apparatus 1000. The means for generating music may use RF energy, vibrations, or signals produced by a series of variable acquisition blocks that are part of the MRF procedure. The means for generating may include a speaker located where the speaker can use a magnetic field produce by basic field magnet(s) 1010. The means for generating may include a transducer positioned on a portion of apparatus 1000 that can be used to generate vibrations that produce audible sounds.

The apparatus 1000 includes a basic field magnet(s) 1010 and a basic field magnet supply 1020. Ideally, the basic field magnets 1010 would produce a uniform $B_0$ field. However, in practice, the $B_0$ field may not be uniform, and may vary over an object being analyzed by the MRF apparatus 1000. MRF apparatus 1000 may include gradient coils 1030 configured to emit gradient magnetic fields like $G_S$, $G_P$ and $G_R$. The gradient coils 1030 may be controlled, at least in part, by a gradient coils supply 1040. In some examples, the timing, strength, and orientation of the gradient magnetic fields may be controlled, and thus selectively adapted, during an MR procedure.

MRF apparatus 1000 may include a set of RF antennas 1050 that are configured to generate RF pulses and to receive resulting nuclear magnetic resonance signals from an object to which the RF pulses are directed. In some examples, how the pulses are generated and how the resulting MR signals are received may be controlled and thus may be selectively adapted during an MR procedure. Separate RF transmission and reception coils can be employed. The RF antennas 1050 may be controlled, at least in part, by a set of RF transmission units 1060. An RF transmission unit 1060 may provide a signal to an RF antenna 1050.

The gradient coils supply 1040 and the RF transmission units 1060 may be controlled, at least in part, by a control computer 1070. In one example, the control computer 1070 may be programmed to control an NMR device as described herein. Conventionally, the magnetic resonance signals received from the RF antennas 1050 can be employed to generate an image and thus may be subject to a transformation process like a two dimensional FFT that generates pixilated image data. The transformation can be performed by an image computer 1080 or other similar processing device. The image data may then be shown on a display 1090.

However, apparatus 1000 facilitates not having to do conventional reconstruction of an image from MR signals received from the RF antennas 1050. Thus the RF energy applied to an object by apparatus 1000 need not be constrained to produce signals with substantially constant amplitudes or phases. Instead, apparatus 1000 facilitates matching received signals to known signals for which a reconstruction, relaxation parameter, or other information is already available. This facilitates producing a quantitative result.

While FIG. 10 illustrates an example MRF apparatus 1000 that includes various components connected in various ways, it is to be appreciated that other MR apparatus may include other components connected in other ways.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one of, A, B, and C" is employed herein, (e.g., a data store configured to store one of, A, B, and C) it is intended to convey the set of possibilities A, B, and C, (e.g., the data store may store only A, only B, or only C). It is not intended to require one of A, one of B, and one of C. When the applicants intend to indicate "at least one of A, at least one of B, and at least one of C", then the phrasing "at least one of A, at least one of B, and at least one of C" will be employed.

To the extent that the phrase "one or more of, A, B, and C" is employed herein, (e.g., a data store configured to store one or more of, A, B, and C) it is intended to convey the set of possibilities A, B, C, AB, AC, BC, ABC, AA . . . A, BB . . . B, CC . . . C, AA . . . ABB . . . B, AA . . . ACC . . . C, BB . . . BCC . . . C, or AA . . . ABB . . . BCC . . . C (e.g., the data store may store only A, only B, only C, A&B, A&C, B&C, A&B&C, or other combinations thereof including multiple instances of A, B, or C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A method for controlling a magnetic resonance (MR) apparatus performing a magnetic resonance fingerprinting (MRF) procedure on a patient, the method comprising:
    selecting an acoustic waveform;
    configuring a series of MRF acquisition blocks as a function of the acoustic waveform, wherein at least one member of the series of variable sequence blocks differs from at least one other member of the series of variable sequence blocks in at least N sequence block parameters, N being an integer greater than one; and
    producing a selected sound in the MR apparatus by causing the MR apparatus to apply one or more gradients and one or more radio frequency (RF) pulses according to the MRF acquisition block as part of the MRF procedure,
    where the selected sound is audible to the patient,
    where the MRF acquisition block includes one or more excitation phases, one or more readout phases, and one or more waiting phases,
    where the MRF acquisition block is one of a series of variable MRF acquisition blocks that are part of the MRF procedure, and
    where at least one member of the series of variable MRF acquisition blocks differs from at least one other member of the series of variable MRF acquisition blocks in one or more sequence block parameters.

2. The method of claim 1, where the sequence block parameters comprise at least one of echo time, flip angle, phase encoding, diffusion encoding, flow encoding, RF pulse amplitude, RF pulse phase, number of RF pulses, type of gradient applied between an excitation portion of an acquisition block and a readout portion of an acquisition block, number of gradients applied between an excitation portion of an acquisition block and a readout portion of an acquisition block, type of gradient applied between a readout portion of an acquisition block and an excitation portion of an acquisition block, number of gradients applied between a readout portion of an acquisition block and an excitation portion of an acquisition block, type of gradient applied during a readout portion of an acquisition block, number of gradients applied during a readout portion of an acquisition block, amount of RF spoiling, and amount of gradient spoiling.

3. The method of claim 2, where varying the at least N sequence block parameters includes varying one or more of, an amount of time between acquisition blocks in the series of variable MRF acquisition blocks, a relative amplitude of RF pulses in acquisition blocks in the series of variable MRF acquisition blocks, and a relative phase of RF pulses in acquisition blocks in the series of variable MRF acquisition blocks.

4. The method of claim 1, where the acoustic waveform is associated with a portion of a piece of music that is played for the patient during the MRF procedure.

5. The method of claim 4, where the piece of music is stored in an MP3 file.

6. The method of claim 1, where configuring the MRF acquisition block comprises matching a gradient waveform associated with the MRF acquisition block to the acoustic waveform.

7. The method of claim 6, comprising matching the gradient waveform to the acoustic waveform as a function of a multi-parametric optimization.

8. The method of claim 7, where the multi-parametric optimization is:

$$G_{opt} = \min_{G} \ \|G - M\| + \alpha \sum G + \beta \sum Gt \quad 5$$

where:
Gopt is an optimized gradient waveform associated with the acquisition block,
G is a candidate gradient waveform,
t is time,
Gt is G times t (the first moment of the gradient waveform),
M is the acoustic waveform,
α is a variable weight, and
β is a variable weight.

9. The method of claim 8, comprising configuring $\min_G \|G - M\|$ to minimize a normal between G and M.

10. The method of claim 9, comprising configuring αΣG as a weighted contribution to Gopt to account for gradient refocusing for a moment of G.

11. The method of claim 10, comprising configuring αΣG to account for gradient refocusing in balanced steady state free precession (bSSFP) MRF, in quick echo split technique (QUEST) MRF, or in fast imaging with steady-state precession (FISP) MRF.

12. The method of claim 11, comprising configuring βΣGt as a flow term to account for gradient refocusing for a different moment of G.

13. The method of claim 12, comprising configuring βΣGt to control for flow sensitivity in the MRF procedure or to control for diffusion sensitivity in the MRF procedure.

14. The method of claim 1, where producing the selected sound in the MR apparatus includes providing a signal to a speaker located in a static magnetic field of the MR apparatus, where the speaker does not include a magnet and where the speaker produces sound using the magnetic field of the MR apparatus.

15. The method of claim 1, where producing the selected sound in the MR apparatus includes providing a signal to a transducer configured to produce a vibration in a portion of the MR apparatus.

16. The method of claim 1, comprising configuring the MRF acquisition block as a function of the acoustic waveform and a sound output model associated with a gradient coil in the MR apparatus.

17. The method of claim 1, where selecting acoustic waveform is chosen as a function of a user choice.

18. The method of claim 1, where configuring the MRF acquisition block comprises optimizing an RF pulse associated with the MRF acquisition block.

19. The method of claim 18, where optimizing the RF pulse includes designing the RF pulse as a function of one or more zero crossings of the acoustic waveform.

20. The method of claim 19, where optimizing the RF pulse includes configuring the RF pulse according to pattern matching between a gradient waveform associated with the RF pulse and the acoustic waveform.

21. The method of claim 18, comprising producing the RF pulse using a variable rate selective excitation (VERSE) approach.

22. An apparatus, comprising:
a processor configured to:
access electronic data concerning a first acoustic waveform;
program a series of magnetic resonance fingerprinting (MRF) sequence blocks as a function of the electronic data, where a sequence block includes one or more excitation phases, one or more readout phases, and one or more waiting phases, and where at least one member of the series of sequence blocks differs from at least one other member of the series of sequence blocks in at least one of, the number of α2 pulses in a sequence block, the spacing of α2 pulses in a sequence block, the phase of α2 pulses in a sequence block, the amplitude of α2 pulses in a sequence block, or a gradient applied during a sequence block; and
control a nuclear magnetic resonance (NMR) apparatus to apply radio frequency (RF) energy to a patient as part of an MRF procedure according to the series of MRF sequence blocks, where applying the RF energy according to the series of MRF sequence blocks produces a second acoustic waveform related to the first acoustic waveform, where sounds produced by the second acoustic waveform are audible to the patient during the MRF procedure.

23. The apparatus of claim 22, wherein the processor is further configured to:
receive a set of data from the NMR apparatus, where the set of data concerns a (k, t, E) space associated with the patient, where t is time and E includes at least one of, T1, T2, and one other parameter, T1 being spin-lattice relaxation, and T2 being spin-spin relaxation, and where one or more of, t, and E, vary non-linearly,
where the (k, t, E) space is produced as a function of applying the RF energy to the patient according to the series of variable MRF sequence blocks.

24. The apparatus of claim 22, where the first acoustic waveform is associated with a user selectable piece of music stored in an MP3 file.

25. The apparatus of claim 22, where the processor is configured to program the series of MRF sequence blocks based, at least in part, on matching a gradient waveform associated with the MRF sequence blocks to the first acoustic waveform based on a multi-parametric optimization.

26. The apparatus of claim 25, where the multi-parametric optimization is:
where:
Gopt is an optimized gradient waveform associated with the acquisition block,
G is the gradient waveform associated with the MRF sequence blocks,
t is time,
Gt is G times t (the first moment of the gradient waveform),
M is the first acoustic waveform,
α is a variable weight,
β is a variable weight,
where F(G,M) is a function of the difference between the gradient sound and a selected sound,
where αΣG is a weighted contribution to Gopt that accounts for gradient refocusing for a zeroeth moment of G, and
where βΣGt is a flow term that accounts for gradient refocusing for a first moment of G.

27. The apparatus of claim 26, where the NMR apparatus includes a speaker or a transducer, and where the processor is configured to provide a control signal to the speaker or transducer, where the control signal is configured to control the speaker or transducer to produce a sound that is a function of a relation between Gopt and the first acoustic waveform.

28. The apparatus of claim 22, where the processor is configured to optimize an RF pulse associated with a member of the series of MRF sequence blocks based, at least in part, on one or more zero crossings of the first acoustic waveform, where optimizing the RF pulse includes configuring the RF pulse so that a gradient waveform associated with the RF pulse and an MRF sequence block matches the first acoustic waveform as closely as possible, so that a gradient waveform associated with the RF pulse and an MRF sequence block is correctable to the first acoustic waveform, or so that a gradient waveform associated with the RF pulse and an MRF sequence block harmonizes with a third acoustic waveform.

29. The apparatus of claim 28, where the processor is configured to produce the RF pulse using a variable rate selective excitation (VERSE) approach.

30. A magnetic resonance fingerprinting (MRF) apparatus, comprising:
   means for generating music that is audible to a patient undergoing an MRF procedure in the MRF apparatus using radio frequency (RF) energy, vibrations, or other physical phenomena produced by a series of variable acquisition blocks that differs from at least one other member of the series of variable sequence blocks in at least N sequence block parameters, N being an integer greater than one, to specify data acquisition during the MRF procedure.

* * * * *